(12) United States Patent
Ota et al.

(10) Patent No.: US 9,331,133 B2
(45) Date of Patent: May 3, 2016

(54) LIGHT EMITTING DEVICE AND ELECTRONIC APPARATUS

(71) Applicant: SEIKO EPSON CORPORATION, Tokyo (JP)

(72) Inventors: Hitoshi Ota, Shiojiri (JP); Ryoichi Nozawa, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/481,413

(22) Filed: Sep. 9, 2014

(65) Prior Publication Data

US 2015/0069363 A1    Mar. 12, 2015

(30) Foreign Application Priority Data

Sep. 12, 2013 (JP) ................................. 2013-189108

(51) Int. Cl.
*H01L 29/08* (2006.01)
*H01L 27/32* (2006.01)

(52) U.S. Cl.
CPC ......... *H01L 27/3262* (2013.01); *H01L 27/3258* (2013.01); *H01L 27/3276* (2013.01); *H01L 2227/323* (2013.01)

(58) Field of Classification Search
CPC .................................. H01L 27/3244–27/3297

USPC ........................................................... 257/40
See application file for complete search history.

(56) References Cited

U.S. PATENT DOCUMENTS

| 6,580,094 | B1 | 6/2003 | Yamazaki et al. |
| 7,279,752 | B2 * | 10/2007 | Yamazaki ............ G09G 3/3275 257/350 |
| 2008/0090321 | A1 * | 4/2008 | Fujita ................ H01L 27/14683 438/57 |
| 2009/0152603 | A1 * | 6/2009 | Kim .................. H01L 27/14632 257/292 |

FOREIGN PATENT DOCUMENTS

| JP | A-2001-195016 | 7/2001 |
| JP | A-2012-083765 | 4/2012 |
| WO | WO2010120733 | * 10/2010 |

* cited by examiner

*Primary Examiner* — Cuong Q Nguyen
*Assistant Examiner* — Nishath Yasmeen
(74) *Attorney, Agent, or Firm* — Oliff PLC

(57) ABSTRACT

On a semiconductor substrate, a plurality of transistors that includes a drive transistor which controls a drive current according to a potential of a gate, a light emitting element that emits a light having a brightness corresponding to the drive current, and an element isolation portion that electrically isolates each transistor are formed. The element isolation portion has a structure in which an insulator fills inside of a groove formed on the semiconductor substrate.

21 Claims, 19 Drawing Sheets

▒ : ELEMENT ISOLATION PORTION (GROOVE PORTION)

LIGHT EMITTING DEVICE AND ELECTRONIC APPARATUS

CROSS REFERENCE

The entire disclose of Japanese Patent Application No. 2013-189108 filed Sep. 12, 2013 is expressly incorporated by reference herein.

BACKGROUND

1. Technical Field

The present invention relates to a light emitting device, for example, in which a light emitting material such as an organic EL material is used.

2. Related Art

A light emitting device in which light emitting elements using, for example, an organic EL material are arrayed on a substrate is proposed as a display device for various electronic apparatuses. In JP-A-2012-083765, a configuration is disclosed, in which a light emission of a light emitting element is controlled using a plurality of transistors formed on a surface of a single crystal semiconductor substrate for each light emitting element. In the technology in JP-A-2012-083765, an oxide film formed by a Local Oxidation of Silicon (LOCOS) method in which a surface of the semiconductor substrate is selectively and thermally oxidized is used for an element isolation of each transistor.

SUMMARY

Incidentally, it is necessary to arrange each light emitting element at a high density for realizing a high-definition image display. However, in the LOCOS method disclosed in JP-A-2012-083765, since it is in principle difficult to sufficiently decrease a gap between each of the transistors, there is a problem in that there is a limitation in achieving the high density of the light emitting elements. An advantage of some aspects of the invention is that the gap between each of the transistors which is used for the driving of the light emitting element is decreased and the high density of the light emitting elements is realized.

According to an aspect of the invention, a light emitting device includes: a semiconductor substrate; a plurality of transistors including a drive transistor which controls a drive current according to a potential of a gate, the plurality of transistors being formed on the semiconductor substrate; a light emitting element that emits a light having a brightness corresponding to the drive current; and an element isolation portion that isolates one transistor from another transistor among the plurality of transistors, the element isolation portion having a Shallow Trench Isolation (STI) structure formed on the semiconductor substrate. In the configuration described above, since each transistor on the semiconductor substrate is isolated by the element isolation portion with a semi-STI structure, compared to the technology disclosed in JP-A-2012-083765 in which an oxide film formed by the LOCOS method is used for isolating the element of each transistor, it is possible to reduce the gap between each of the transistors T. Therefore, it is advantageous in the point that the high density of the light emitting elements can be realized. The STI structure adopted in the element isolation portion means a structure (embedded type) in which an insulator (typically, an oxide layer) fills a groove portion formed on the surface of the semiconductor substrate.

It is preferable that the plurality of transistors includes a first transistor that sets the potential of the gate of the drive transistor according to a gradation potential, and the element isolation portion isolates the drive transistor from the first transistor. In this case, it is possible to effectively isolate (prevent the current inside of the semiconductor substrate from leaking) the first transistor that sets the potential of the gate of the drive transistor according to the gradation potential from the drive transistor.

It is preferable that the plurality of transistors includes a second transistor that is disposed on a path of the drive current and controls a supply and cut-off of the drive current to the light emitting element, and the element isolation portion isolates the drive transistor from the second transistor. In this case, it is possible to effectively isolate the second transistor that controls the supply and cut-off of the drive current to the light emitting element from the drive transistor.

It is preferable that the plurality of transistors includes a third transistor that controls conduction between the gate and a drain of the drive transistor, and the element isolation portion isolates the drive transistor from the third transistor. In this case, it is possible to effectively isolate the third transistor that controls conduction between the gate and a drain of the drive transistor from the drive transistor.

It is preferable that each of the plurality of transistors includes a diffusion layer that functions as one of a source or the drain, and a thickness of the element isolation portion is greater than a thickness of the diffusion layer. In this case, since the thickness of the element isolation portion is greater than the thickness of the diffusion layer, in comparison to a configuration in which the thickness of the element isolation portion is less than the thickness of the diffusion layer, it is advantageous in the point that the leakage of the current between each diffusion layer of each of transistors adjacent to each other can be prevented.

It is preferable that a width of the element isolation portion is greater than a channel width (for example, a maximum value of the channel width of the plurality of transistors) of one transistor among the plurality of transistors. In this case, since the width of the element isolation portion is set to be greater than a channel width of the transistor, in comparison to a configuration in which the width of the element isolation portion is less than a channel width of the transistor, it is advantageous in the point that each transistor can be effectively isolated.

It is preferable that the plurality of transistors each includes two or more transistors including the drive transistor for each of a plurality of pixels, and the element isolation portion isolates the transistor of a first pixel among the plurality of pixels and the transistor of a second pixel adjacent to the first pixel. In this case, it is advantageous in the point that the transistors are also effectively isolated between each of pixels adjacent to each other, in addition to the point that each transistor in one pixel is isolated. It is preferable that, in the element isolation portion, a width of a portion that isolates the transistor of the first pixel and the transistor of the second pixel is greater than the channel width of one transistor among the plurality of transistors. In this case, the effects described above are particularly prominent in such a configuration.

It is preferable that the element isolation portion has a structure in which an insulator fills a groove portion formed on the semiconductor substrate.

According to another aspect of the invention, a light emitting device includes: a semiconductor substrate; a plurality of transistors formed on the semiconductor substrate; a light emitting element; a groove portion formed on the semiconductor substrate; and an insulator fills inside of the groove portion. The plurality of transistors includes a drive transistor that controls a drive current flowing in the light emitting element according to a potential of a gate, and the insulator is disposed between one transistor and another transistor among the plurality of transistors.

The light emitting device in each aspect described above is used, for example, as a display device in various electronic apparatuses. Specifically, a head mounted type display device or an electronic viewfinder of an imaging apparatus can be exemplified as a preferred example of the electronic apparatus in the invention. However, the application range of the invention is not limited thereto.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
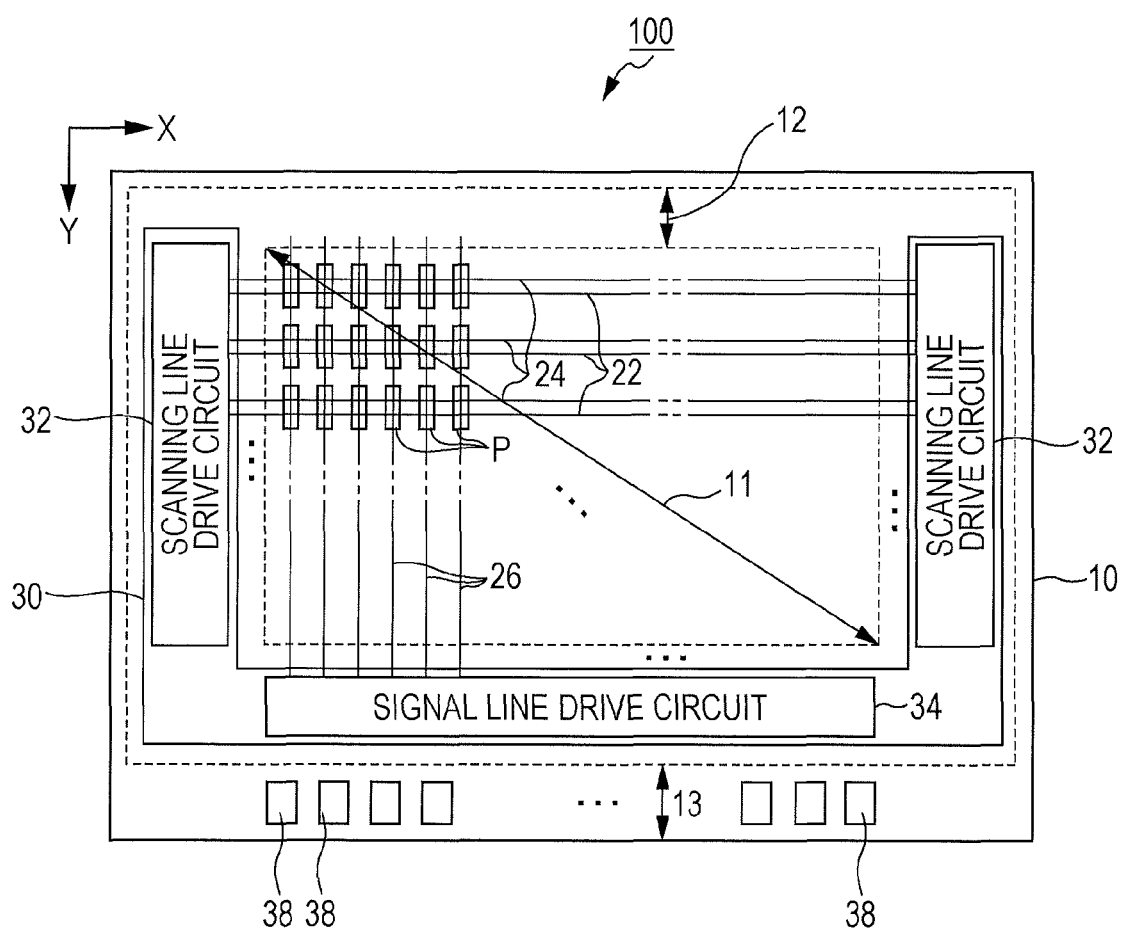
FIG. 1 is a plan view of the light emitting device in a first embodiment of the invention.

FIG. 1 is a plan view of a light emitting device 100 in a first embodiment of the invention. The light emitting device 100 in the first embodiment is an organic EL device in which a plurality of pixels P that includes light emitting elements using an organic EL material are formed on the surface of a semiconductor substrate 10. The semiconductor substrate 10 is a plate-shaped member formed from a single crystal of a semiconductor material such as silicon.

As illustrated in FIG. 1, the surface of the semiconductor substrate 10 is demarcated into a display region 11, a peripheral region 12, and a mounting region 13. The display region 11 is a rectangular region on which the plurality of pixels P is arrayed. On the display region 11, a plurality of scanning lines 22 extending in an X direction, a plurality of control lines 24 corresponding to each scanning line 22 extending in the X direction, and a plurality of signal lines 26 extending in a Y direction crossing the X direction are formed. The pixels P are formed corresponding to the crossing of the plurality of scanning lines 22 and the plurality of signal lines 26. Therefore, the plurality of pixels P is arrayed in a matrix shape in the X and the Y directions.

The peripheral region 12 is a rectangular frame-shaped region surrounding the display region 11. In the peripheral region 12, a drive circuit 30 is installed. The drive circuit 30 is a circuit that drives each pixel P in the display region 11, and is configured to include two scanning line drive circuits 32 and a signal line drive circuit 34. The light emitting device 100 in the first embodiment is a circuit embedded type display device in which the drive circuit 30 is configured with active elements such as transistors which are directly formed on the surface of the semiconductor substrate 10.

The mounting region 13 is a region of the opposite side (that is, outside of the peripheral region 12) of the display region 11 across the peripheral region 12, and a plurality of mounting terminals 38 is arrayed thereon. A control signal and power potential from various external circuits (not illustrated) such as a control circuit and a power circuit are supplied to the mounting terminals 38. The external circuits are, for example, mounted on a flexible wiring substrate (not illustrated) which is bonded to the mounting region 13.

Figure 2:
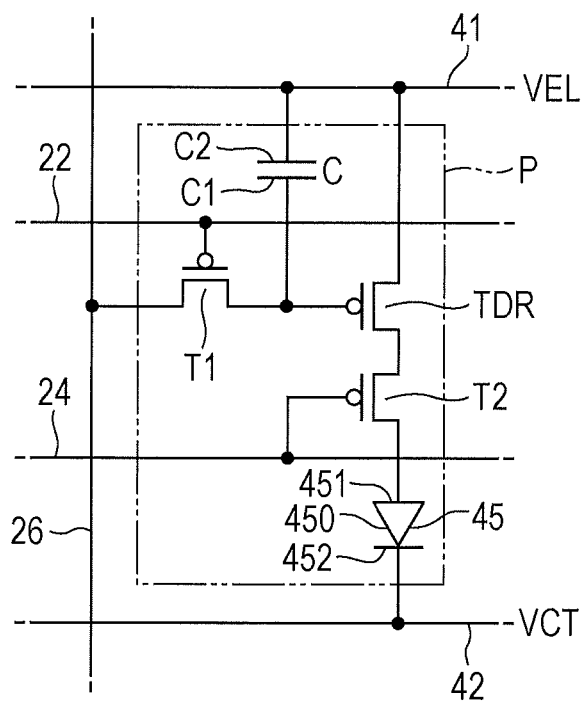
FIG. 2 is a circuit diagram of a pixel.

FIG. 2 is a circuit diagram of each pixel (pixel circuit) P. As illustrated in FIG. 2, any arbitrary one pixel P in the display region 11 is configured to include a light emitting element 45, a plurality of transistors T (TDR, T1, and T2), and a capacitance element C. Each transistor T is an active element directly formed on the surface of the semiconductor substrate 10. One pixel P in the first embodiment includes three transistors: a drive transistor TDR, a selection transistor (a first transistor) T1, and a light emission control transistor (a second transistor) T2. In the example in FIG. 2, P channel type transistors are used for each transistor T (TDR, T1, and T2) of the pixel P. However, N channel type transistors can be used as well.

The light emitting element 45 is an electro-optical element in which a light emitting function layer 450 that includes a light emitting layer of the organic EL material is interposed between a first electrode 451 (an anode) and a second electrode 452 (a cathode). The first electrode 451 is individually formed for each pixel P and the second electrode 452 is continuously formed over the plurality of pixels P. As can be understood from FIG. 2, the light emitting element 45 is disposed on the current path that connects a first power conductor 41 and a second power conductor 42. The first power conductor 41 is a power source wiring to which a higher-side power potential VEL is supplied, and the second power conductor 42 is a power source wiring to which a lower-side power potential VCT is supplied.

The drive transistor TDR and the light emission control transistor T2 are disposed in series with respect to the light emitting element 45 on the path connecting the first power conductor 41 and the second power conductor 42. A source of the drive transistor TDR is connected to the first power conductor 41 and generates a drive current having an amount corresponding to an electric potential of the gate of itself (a voltage between a gate and the source). The light emission control transistor T2 functions as a switch that controls a conduction state (conductive/non-conductive) between a drain of the drive transistor TDR and the first electrode 451 of the light emitting element 45. In a state where the light emission control transistor T2 is controlled to be in an ON state, the drive current is supplied to the light emitting element 45 from the drive transistor TDR via the light emission control transistor T2, and thus, the light emitting element 45 emits light having a brightness corresponding to the current amount of the drive current. In a state where the light emission control transistor T2 is controlled to be in an OFF state, the supply of the drive current to the light emitting element 45 is cut off, and thus, the light emitting element 45 is turned off. That is, the light emission control transistor T2 is disposed on the path of drive current and controls whether or not to supply the drive current (supply/cut off) to the light emitting element 45. A gate of the light emission control transistor T2 is connected to the control line 24.

The selection transistor T1 in FIG. 2 functions as a switch that controls the conduction state (conductive/non-conductive) between the signal line 26 and a gate of the drive transistor TDR. A gate of the selection transistor T1 is connected to the scanning line 22. In addition, the capacitance element C is an electrostatic capacitance in which a dielectric is interposed between a first electrode C1 and a second electrode C2. The first electrode C1 is connected to the gate of the drive transistor TDR and the second electrode C2 is connected to the first power conductor 41 (the source of the drive transistor TDR). Therefore, the capacitance element C holds the voltage between the gate and the source of the drive transistor TDR.

The signal line drive circuit 34 supplies a gradation voltage (a data signal) corresponding to a gradation designated for each pixel P by an image signal supplied from an external circuit, in parallel with respect to a plurality of signal lines 26 for each writing period (horizontal scanning period). On the other hand, the scanning line drive circuit 32 sequentially selects each of the plurality of scanning lines 22 for each writing period by supplying the scanning signal to each scanning line 22. The selection transistor T1 of each pixel P corresponding to the scanning line 22 selected by the scanning line drive circuit 32 shifts to an ON state. Therefore, the gradation potential is supplied to the gate of the drive transistor TDR of each pixel P via the signal line 26 and the selection transistor T1, and a voltage corresponding to the gradation potential is held in the capacitance element C. That is, the selection transistor T1 sets the electric potential at the gate of the drive transistor TDR according to the gradation potential.

On the other hand, when the writing period has elapsed and the selection by the scanning line 22 ends, each scanning line drive circuit 32 controls the light emission control transistor T2 of each pixel P corresponding to the control line 24 such that it is brought into an ON state by supplying the control signal to each control line 24 in the light emitting period. Therefore, in the light emitting period, the drive current corresponding to the voltage held in the capacitance element C during the immediately preceding writing period is supplied to the light emitting element 45 from the drive transistor TDR via the light emission control transistor T2. As described above, by each light emitting element 45 emitting the light having a brightness corresponding to the gradation potential, an arbitrary image designated by the image signal is displayed on the display region 11.

Figure 3:
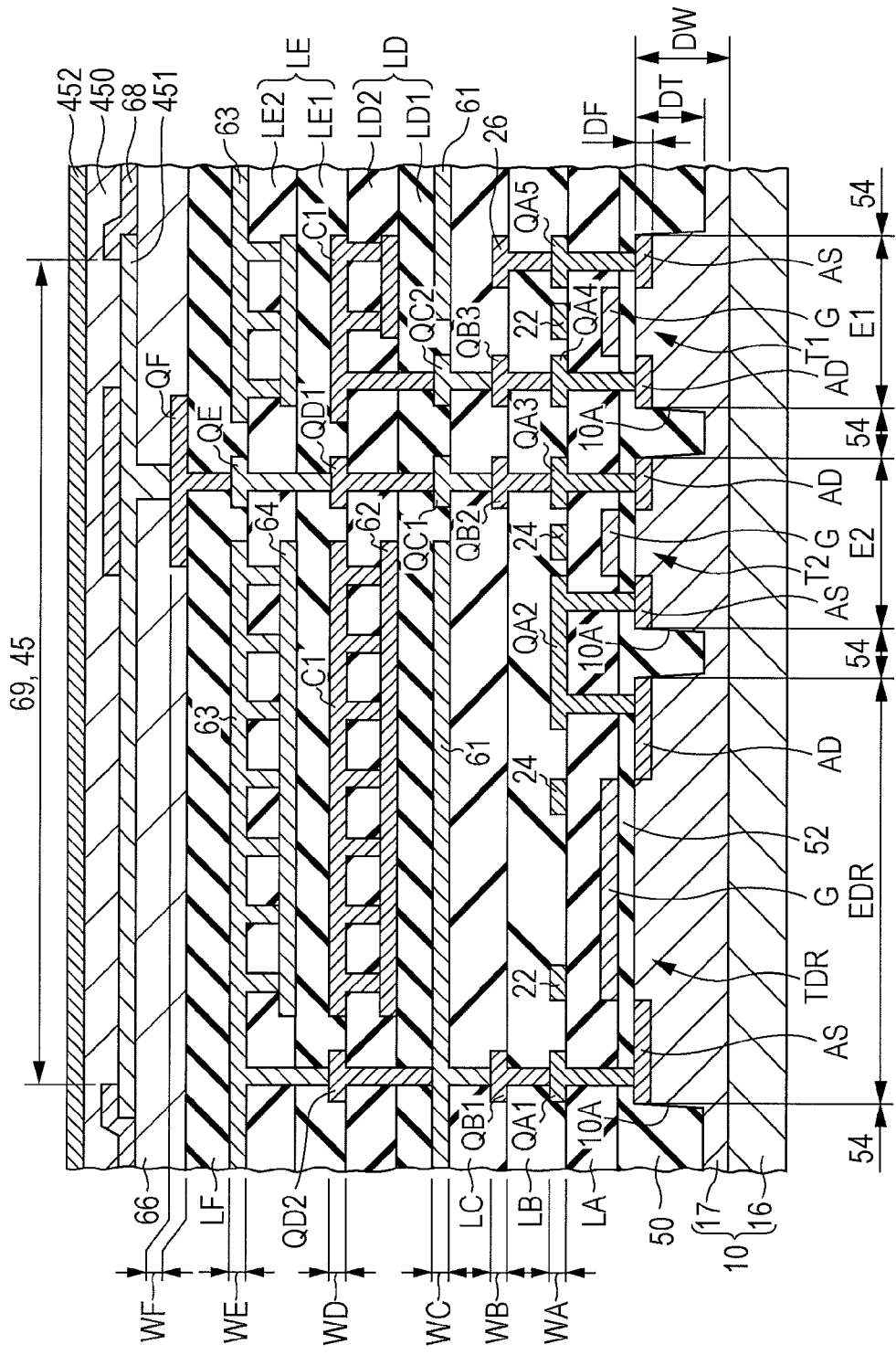
FIG. 3 is a cross-sectional diagram of a light emitting device.

A detailed configuration of the light emitting device 100 in the first embodiment will be described below. FIG. 3 is a cross-sectional diagram of the light emitting device 100. As illustrated in FIG. 3, on the surface of the semiconductor substrate 10 formed of a single crystal of a semiconductor material such as silicon, the transistor T (TDR, T1, and T2) of each pixel P is formed. Specifically, each transistor T is formed using an N-type well (n-well) 17 formed on the surface of the P-type substrate (p-sub) 16 of the semiconductor substrate 10.

FIG. 6 to FIG. 14 are plan views illustrating appearance of the surfaces of the semiconductor substrates 10 in each stage of forming each of elements of the light emitting device 100 focusing on one pixel. The sectional view taken along the III-III lines in FIG. 6 to FIG. 14 corresponds to FIG. 3. FIG. 6 to FIG. 14 are plan views, however, from the viewpoint of facilitating visual understanding of each element, the same hatching as in FIG. 3 is appended to each element common to the element in FIG. 3 for convenience. In addition, in the drawings referred to for the description hereinafter, for the sake of convenience in describing, the size and the scale of each element may appropriately be different from those of an actual device.

Figure 6:
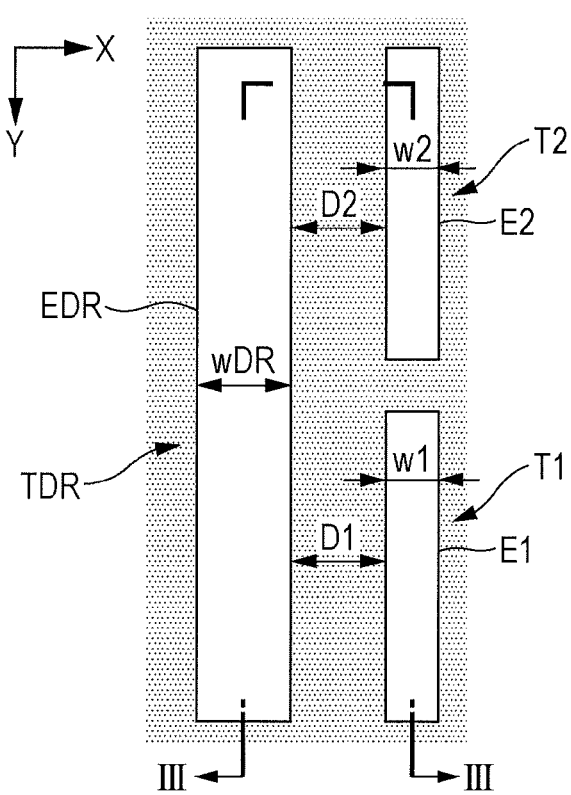
FIG. 6 is a plan view of each element portion and the element isolation portion.

As can be understood from FIG. 3 and FIG. 6, a plurality of element portions E (EDR, E1, and E2) that correspond to each transistor T (TDR, T1, and T2) of the pixel P is formed on the well 17 of the semiconductor substrate 10. Specifically, the element portion EDR of the drive transistor TDR, the element portion E1 of the selection transistor T1, and the element portion E2 of the light emission control transistor T2 are formed on the semiconductor substrate 10. Each of element portions E is formed in an island shape isolated from each other by a groove portion (trench) 10A formed on the well 17 of the semiconductor substrate 10. The groove portion 10A that demarcates each element portion E is a region where the N-type well 17 formed on the surface of the semiconductor substrate 10 is partially removed. In the first embodiment, as illustrated in FIG. 6, the element portion EDR of the drive transistor TDR is formed in a strip shape extending in the Y direction in a plan view, and the element portion E1 of the selection transistor T1 and the element portion E2 of the light emission control transistor T2 are formed in a strip shape extending in the Y direction with opening gaps having same sizes with respect to the element portion EDR in a plan view. The element portion E1 and the element portion E2 are arrayed in the Y direction with a gap therebetween.

A depth DT of the groove portion 10A illustrated in FIG. 3 is a distance between the surface of the semiconductor substrate 10 (well 17) and the bottom surface of the groove portion 10A. The depth DT of the groove portion 10A is set, for example, within the range of equal to or greater than 300 nm and equal to or less than 1000 nm (for example, approximately a few hundred nm). As understood from FIG. 3, the depth DT of the groove portion 10A is less than a thickness of the well 17 DW (DT<DW). Therefore, the bottom surface of the groove portion 10A is formed of the N-type well 17.

As illustrated in FIG. 3, on the surface of the semiconductor substrate 10 (well 17) on which the element portion E of each transistor T is formed, an insulation layer 50 is formed. The insulation layer 50 is formed of an inorganic insulation material such as, for example, a silicon compound (typically, silicon nitride or silicon oxide), and is configured to include an insulation film 52 and an element isolation portion 54. The insulation film 52 is a portion positioned on the surface of each element portion E of the insulation layer 50, and functions as a gate insulation film of each transistor T. On the other hand, the element isolation portion 54 is a portion formed inside of the groove portion 10A (that is, between each of the element portions E), and functions as an element for electrically insulating each transistor T (isolating the elements). As understood from the above description, in the first embodiment, the element isolation portion 54 having an Shallow Trench Isolation (STI) structure which electrically isolates each transistor T is formed. Specifically, the element isolation portion 54 isolates the drive transistor TDR and the selection transistor T1, isolates the drive transistor TDR and the light emission control transistor T2, and isolates the selection transistor T1 and the light emission control transistor T2. The above description is focused on the transistor T of each pixel P. However, similarly to each transistor T of each pixel P, each transistor that configures the drive circuit 30 formed in the peripheral region 12 is also electrically isolated by the element isolation portion 54 having the STI structure.

Figure 4:
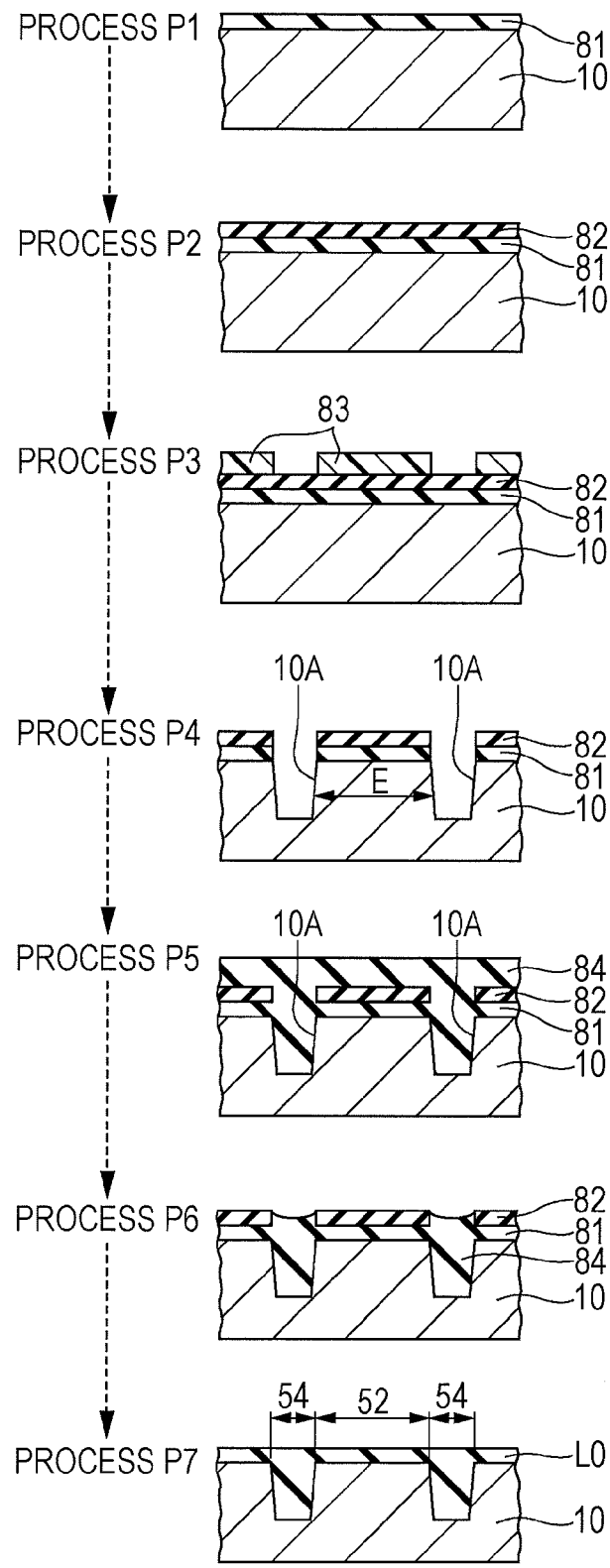
FIG. 4 is an explanatory diagram of a process of manufacturing an element isolation portion.

FIG. 4 is a process diagram illustrating a method of manufacturing the insulation layer 50. First, for example, an oxide film 81 is formed by thermal oxidation of the surface of the semiconductor substrate 10 (Process P1), and a nitride film (silicon nitride) 82 is formed on the surface of the oxide film 81 (Process P2). In forming the nitride film 82, a known deposition technology such as a Chemical Vapor Deposition (CVD) is arbitrarily employed.

A resist layer 83 is formed on the surface of the nitride film 82 (Process 3). Specifically, the resist layer 83 is formed so as to cover the region where the element portion E of each transistor T is subject to be formed in a plan view in the surface (surface of the nitride film) of the semiconductor substrate 10. In forming the resist layer 83, a known deposition technology such as a photolithography technology is arbitrarily employed. The groove portion 10A (element portion E) is formed by selectively removing the nitride film 82, the oxide film 81, and the semiconductor substrate 10 using an etching in which the resist layer 83 formed in Process P3 is used as a mask (Process P4).

An oxide film (silicon oxide) 84 is formed on the surface of the semiconductor substrate 10 (Process P5). The oxide film fills the groove portion 10A and covers the nitride film 82. The oxide film 84 can be formed, for example, by thermal oxidation in the inner wall surface of the groove portion 10A and a known deposition technology such as a Chemical Vapor Deposition. Then, in the oxide film 84, a portion on the surface of the nitride film 82 is removed (Process P6). In removing the oxide film 84, a known processing technology such as a chemical mechanical polishing (CMP) is arbitrarily employed. The nitride film 82 is thinned by the chemical mechanical polishing. When the oxide film 84 on the surface of the nitride film 82 is removed in Process P6, the nitride film 82 is removed (Process P7). By the processes described above, the insulation layer 50 that includes the insulation film 52 on the surface of the element portion E and the element isolation portion 54 in the groove portion 10A are formed.

Figure 7:
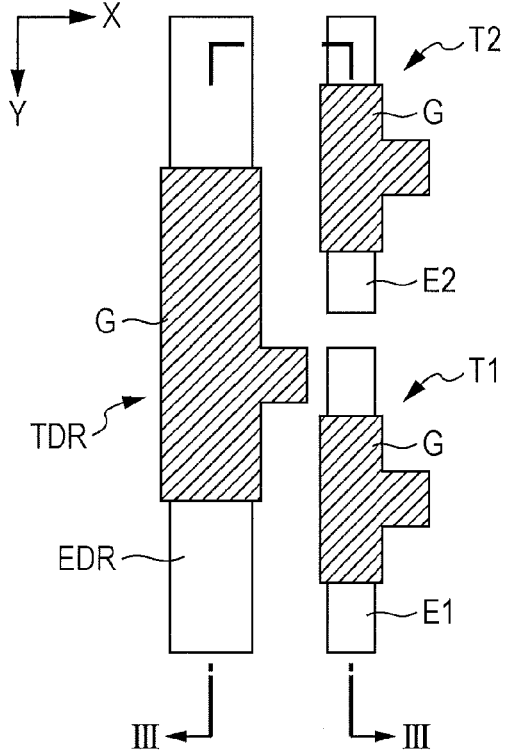
FIG. 7 is a plan view of a gate of each transistor.

As illustrated in FIG. 3 and FIG. 7, a gate G of each transistor T (TDR, T1, and T2) is formed on the surface of the insulation layer 50. That is, the element portion E (channel region) and the gate G are facing each other interposing the insulation film 52 (insulation layer 50). In each position interposing the gate G in a plan view of the element portion E of each transistor T, as illustrated in FIG. 3, a diffusion layer AS and a diffusion layer AD are formed. The diffusion layers AS and AD are portions having a predetermined thickness in which an impurity ion having an opposite conductivity type (that is, P-type) with respect to the N-type well 17 is induced and diffused. As understood from the above description, each transistor T of the light emitting device 100 is a metal oxide semiconductor field effect transistor (MOSFET) that is configured with the element portion E in which the diffusion layer AS and the diffusion layer AD are formed, the insulation film 52 that covers the element portion E (channel region), and the gate G that is facing the region (channel region) between the diffusion layer AS and the diffusion layer AD of the element portion E on the surface of the insulation film 52.

As understood from FIG. 3, the thickness DT of the element isolation portion 54 (thickness of the groove portion 10A) in the first embodiment is greater than the thickness DF of the diffusion layer AS and the diffusion layer AD. Therefore, in comparison to the configuration in which the thickness DT of the element isolation portion 54 is less than the thickness DF of the diffusion layer AS or the diffusion layer AD, it is advantageous in the point that a leakage of the current between the diffusion layers A (AD and AS) of each of transistors T that are adjacent to each other can be prevented (each transistor can be reliably isolated).

As understood from FIG. 6 and FIG. 7, a channel width wDR (for example, 500 nm) of the drive transistor TDR is greater than a channel width w1 of the selection transistor T1 and a channel width w2 of the light emission control transistor T2 (w2≅w1). Designation D1 in FIG. 6 corresponds to a width of the element isolation portion 54 positioned between the element portion EDR of the drive transistor TDR and the element portion E1 of the selection transistor T1 (a gap between the element portion EDR and the element portion E1 in the X direction). Similarly, designation D2 corresponds to a width of the element isolation portion 54 positioned between the element portion EDR of the drive transistor TDR and the element portion E2 of the light emission control transistor T2 (a gap between the element portion EDR and the element portion E2 in the X direction). In the first embodiment, the width D1 and D2 of the element isolation portion 54 in the X direction are greater than the channel width w1 of the selection transistor T1 and the channel width w2 of the light emission control transistor T2 (D1 and D2>w1 and w2), and further preferably, are greater than the channel width wDR of the drive transistor TDR (D1 and D2>wDR). As described above, in the first embodiment, since a sufficient width is secured in the element isolation portion 54 positioned between the transistors T adjacent to each other in the X direction, it is advantageous in the point that each transistor T in the pixel P can effectively be isolated.

Figure 5:
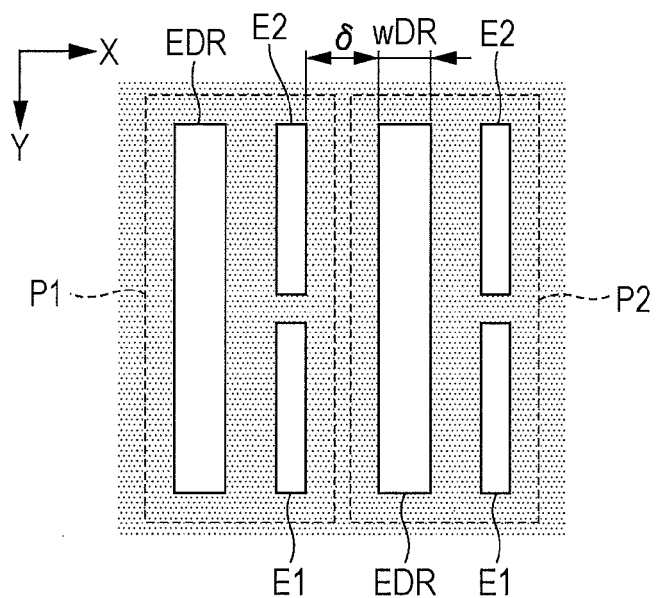
FIG. 5 is an explanatory diagram of the element isolation portion (groove portion) between the pixels.

In addition, as illustrated in FIG. 5, if any of two pixels P (P1 and P2) adjacent to each other in the display region 11 are focused on, a width δ of the element isolation portion 54 between each of the transistors T of the pixel P1 and each transistor T of the pixel P2 is greater than the channel width w1 of the selection transistor T1 and the channel width w2 of the light emission control transistor T2 (δ>w1 and w2), and further preferably, is greater than the channel width wDR of the drive transistor TDR (δ>wDR). The width δ of the element isolation portion 54 between the pixels corresponds to, for example, a gap in the X direction between the element portion E1 of the selection transistor T1 of the pixel P1 or the element portion E2 of the light emission control transistor T2 and the element portion EDR of the drive transistor TDR of the pixel P2 (a shortest distance between each of the element portions E in the pixels P). As described above, in the first embodiment, since a sufficient width is secured in the element isolation portion 54 positioned between the pixels P adjacent to each other, it is advantageous in the point that each transistor T between the pixels P can effectively be isolated.

On the surface of the insulation layer 50 on which the gate G of each transistor T is formed, as illustrated in FIG. 3, a multilayer wiring layer formed by alternatively depositing a plurality of insulation layers L (LA to LF) and a plurality of wiring layers W (WA to WF) is formed. Each insulation layer L is formed of an inorganic insulation material such as a silicon compound (typically, silicon nitride or silicon oxide). In addition, each wiring layer W is formed of a low resistance conductive material which contains aluminum or silver. In the description below, a relationship in which a plurality of elements is collectively formed in one process by selectively removing the conductive layer (a single layer or a multilayer) will be referred to as "formed from the same layer".

Figure 8:
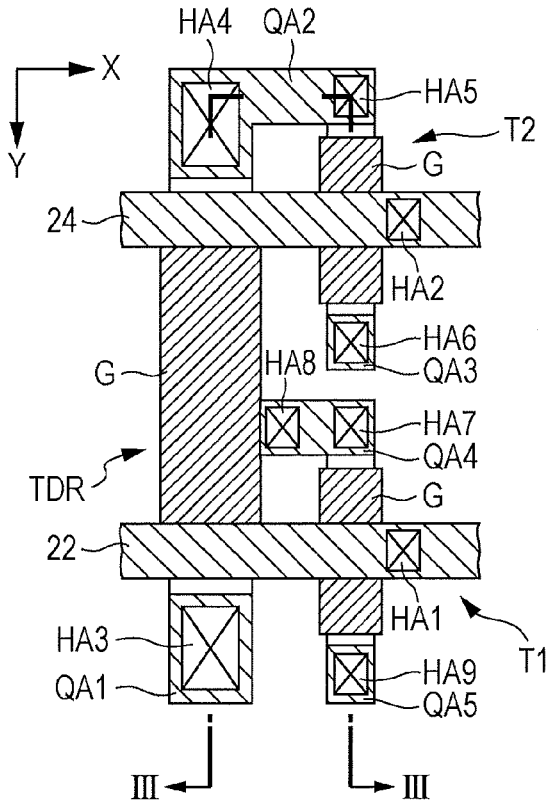
FIG. 8 is a plan view of a wiring layer WA.

An insulation layer LA in FIG. 3 is formed on the surface of the insulation layer 50 (insulation film 52) on which the gate G of each transistor T is formed. As illustrated in FIG. 3 and FIG. 8, on the surface of the insulation layer LA, a conductive pattern including the scanning line 22, the control line 24, and a plurality of relaying electrodes QA (QA1 to QA5) is formed from the same layer (wiring layer WA). As understood from FIG. 8, the scanning line 22 and the control line 24 extend in the X direction with opening a gap to each other in the Y direction. The scanning line 22 is conductively connected to the gate G of the selection transistor T1 via a through hole (contact hole) HA1 penetrating the insulation layer LA, and the control line 24 is conductively connected to the gate G of the light emission control transistor T2 via a through hole HA2 penetrating the insulation layer LA.

A relaying electrode QA1 is conductively connected to the diffusion layer AS of the drive transistor TDR via a through hole HA3 penetrating the insulation layer LA and the insulation layer 50. A relaying electrode QA2, as understood from FIG. 3 and FIG. 8, is conductively connected to the diffusion layer AD (drain) of the drive transistor TDR via a through hole HA4 penetrating the insulation layer LA and the insulation layer 50, and is conductively connected to the diffusion layer AS (source) of the light emission control transistor T2 via a through hole HA5 penetrating the insulation layer LA and the insulation layer 50. That is, as described referring to FIG. 2, the drive transistor TDR and the light emission control transistor T2 are connected in series.

A relaying electrode QA3 is conductively connected to the diffusion layer AD of the light emission control transistor T2 via a through hole HA6 penetrating the insulation layer LA and the insulation layer 50. A relaying electrode QA4, as understood from FIG. 3 and FIG. 8, is conductively connected to the diffusion layer AD of the selection transistor T1 via a through hole HA7 penetrating the insulation layer LA and the insulation layer 50 and is conductively connected to the gate G of the drive transistor TDR via a through hole HA8 penetrating the insulation layer LA. That is, as described referring to FIG. 2, the gate G of the drive transistor TDR is connected to the selection transistor T1. A relaying electrode QA5 is conductively connected to the diffusion layer AS of the selection transistor T1 via a through hole HA9 penetrating the insulation layer LA and the insulation layer 50.

Figure 9:
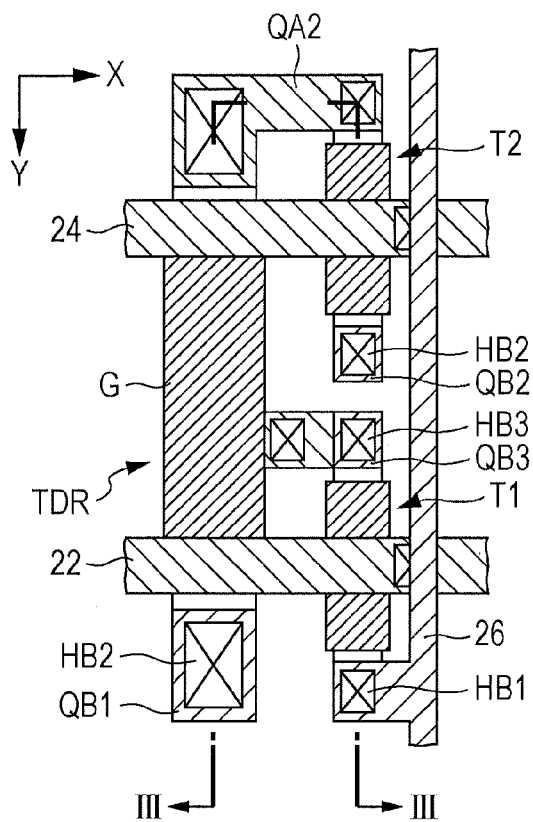
FIG. 9 is a plan view of a wiring layer WB.

An insulation layer LB in FIG. 3 is formed on the surface of the insulation layer LA on which the wiring layer WA is formed. As illustrated in FIG. 3 and FIG. 9, on the surface of the insulation layer LB, a semiconductor pattern including the signal line 26 and a plurality of relaying electrodes QB (QB1 to QB3) is formed from the same layer (a wiring layer WB). As understood from FIG. 9, the signal line 26 is formed in a straight line shape extended in the Y direction, and is conductively connected to the relaying electrode QA5 via a through hole HB1 penetrating the insulation layer LB. That is, as understood from FIG. 3 and FIG. 9, the signal line 26 is conductively connected to the diffusion layer AS of the selection transistor T1 via the relaying electrode QA5 of the wiring layer WA. In addition, a relaying electrode QB1 is conductively connected to the relaying electrode QA1 of the wiring layer WA via a through hole HB2 penetrating the wiring layer LB. A relaying electrode QB2 is conductively connected to the relaying electrode QA3 of a wiring layer WA via the through hole HB2 penetrating the wiring layer LB, and a relaying electrode QB3 is conductively connected to the relaying electrode QA4 (the gate G of the drive transistor TDR) of the wiring layer WA via a through hole HB3 penetrating the insulation layer LB.

Figure 10:
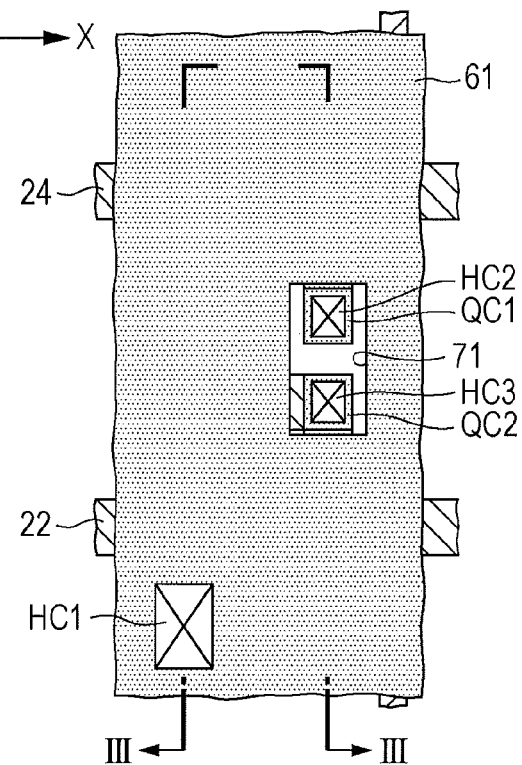
FIG. 10 is a plan view of a wiring layer WC.

An insulation layer LC in FIG. 3 is formed on the surface of the insulation layer LB on which the wiring layer WB is formed. As illustrated in FIG. 3 and FIG. 10, on the surface of the insulation layer LC, a semiconductor pattern that includes a first conduction layer 61 and a plurality of relaying electrodes QC (QC1 and QC2) is formed from the same layer (wiring layer WC). The first conduction layer 61 is continuously formed over the entire display region 11 and configures the first power conductor 41 in FIG. 2. Specifically, the first conduction layer 61 is electrically connected to the mounting terminal 38 to which a higher-side power potential VEL is supplied, and as understood from FIG. 10, the first conduction layer 61 is conductively connected to the relaying electrode QB1 of the wiring layer WB via a through hole HC1 penetrating the insulation layer LC. That is, the power potential VEL supplied to the mounting terminal 38 reaches the diffusion layer AS (source) of the drive transistor TDR via the first conduction layer 61, the relaying electrode QB1, and the relaying electrode QA1.

As illustrated in FIG. 10, an opening portion 71 is formed on the first conduction layer 61 for each pixel P. A relaying electrode QC1 and a relaying electrode QC2 are formed inside of the opening portion 71. The relaying electrode QC1 is conductively connected to the relaying electrode QB2 of the wiring layer WB via a through hole HC2 penetrating the insulation layer LC, and a relaying electrode QC2 is conductively connected to the relaying electrode QB3 of the wiring layer WB via a through hole HC3 penetrating the insulation layer LC.

Figure 11:
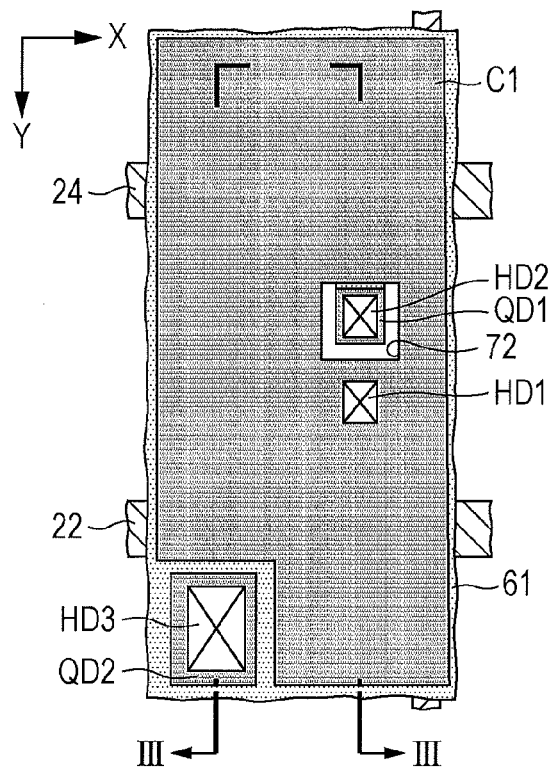
FIG. 11 is a plan view of a wiring layer WD.

An insulation layer LD in FIG. 3 is formed on the surface of the insulation layer LC on which the wiring layer WC is formed. As illustrated in FIG. 3 and FIG. 11, on the surface of the insulation layer LD, a semiconductor pattern that includes the first electrode C1 of the capacitance element C and a plurality of relaying electrodes QD (QD1 and QD2) is formed from the same layer (a wiring layer WD). The first electrode C1, as understood from FIG. 11, is individually formed for each pixel P and is conductively connected to the relaying electrode QC2 of the wiring layer WC via a through hole HD1 penetrating the wiring layer WD. That is, as described referring to FIG. 2, the first electrode C1 of the capacitance element C is electrically connected to the gate G of the drive transistor TDR via the relaying electrode QC2, relaying electrode QB3, and relaying electrode QA4.

As illustrated in FIG. 11, an opening portion 72 is formed on the first electrode C1. A relaying electrode QD1 is formed inside of the opening portion 72, and is conductively connected to the relaying electrode QC1 of the wiring layer WC via a through hole HD2 penetrating the insulation layer LD. On the other hand, a relaying electrode QD2 is conductively connected to the first conduction layer 61 of the wiring layer WC via a through hole HD3 penetrating the insulation layer LD.

In FIG. 3, a configuration in which a first layer LD1 and a second layer LD2 are deposited to configure the insulation layer LD is illustrated. On the surface of the first layer LD1 (between the first layer LD1 and the second layer LD2), an auxiliary electrode 62 is formed. The first electrode C1 formed on the surface of the insulation layer LD (the second layer LD2) is conductively connected to the auxiliary electrode 62 via a plurality of through holes penetrating the second layer LD2. The auxiliary electrode 62 is an auxiliary electrode for increasing the capacitance value of the capacitance element C. A configuration in which the auxiliary electrode 62 is omitted (a configuration in which the insulation layer LD is formed in a single layer) can also be adopted.

Figure 12:
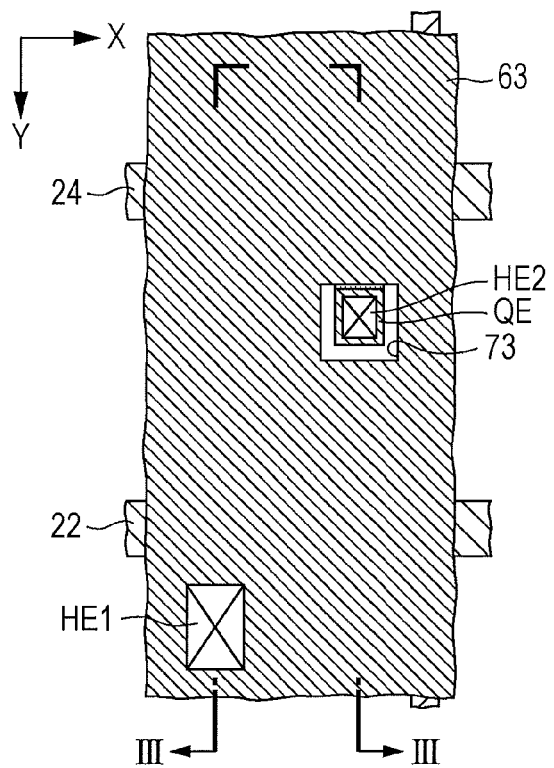
FIG. 12 is a plan view of a wiring layer WE.

An insulation layer LE in FIG. 3 is formed on the surface of the insulation layer LD on which the wiring layer WD is formed. As illustrated in FIG. 3 and FIG. 12, on the surface of the insulation layer LE, a semiconductor pattern that includes a second conduction layer 63 and a relaying electrode QE is formed from the same layer (a wiring layer WE). The wiring layer WE is formed of a light-reflective and conductive material which contains silver or aluminum.

The second conduction layer 63, as understood from FIG. 12, is continuously formed over the entire display region 11 similar to the first conduction layer 61, and is conductively connected to the relaying electrode QD2 of the wiring layer WD via a through hole HE1 penetrating the insulation layer LE. That is, the second conduction layer 63 is electrically connected to the first conduction layer 61 (FIG. 10) via the relaying electrode QD2. Therefore, as is similar to the first conduction layer 61, the higher-side power potential VEL is supplied to the second conduction layer 63. As understood from the above description, the second conduction layer 63 configures the first power conductor 41 in FIG. 2 together with the first conduction layer 61. As illustrated in FIG. 12, an opening portion 73 is formed on the second conduction layer 63 for each pixel P. The relaying electrode QE is formed inside of the opening portion 73, and is conductively connected to the relaying electrode QD1 of the wiring layer WD via a through hole HE2 penetrating the insulation layer LE.

In FIG. 3, a configuration in which a first layer LE1 and a second layer LE2 are deposited to configure the insulation layer LE is illustrated. On the surface of the first layer LE1 (between the first layer LE1 and the second layer LE2), an auxiliary electrode 64 is formed. The second conduction layer 63 formed on the surface of the insulation layer LE (the second layer LE2) is conductively connected to the auxiliary electrode 64 via a plurality of through holes penetrating the second layer LE2. As is similar to the auxiliary electrode 62, the auxiliary electrode 64 is an auxiliary electrode for increasing the electrostatic capacitance value of the capacitance element C. A configuration in which the auxiliary electrode 64 is omitted (a configuration in which the insulation layer LE is formed in a single layer) can also be adopted.

As understood from the above description, a capacitance in which the insulation layer LD is interposed between the first conduction layer 61 and the first electrode C1 (the auxiliary electrode 62) and a capacitance in which the insulation layer LE is interposed between the second conduction layer 63 (the auxiliary electrode 64) and the first electrode C1 function as the capacitance element C described above referring to FIG. 2. As understood from the above description, the first conduction layer 61 and second conduction layer 63 function as the first power conductor 41 that supplies the power source potential VEL and the second electrode C2 that forms the capacitance element C with the first electrode C1.

Figure 13:
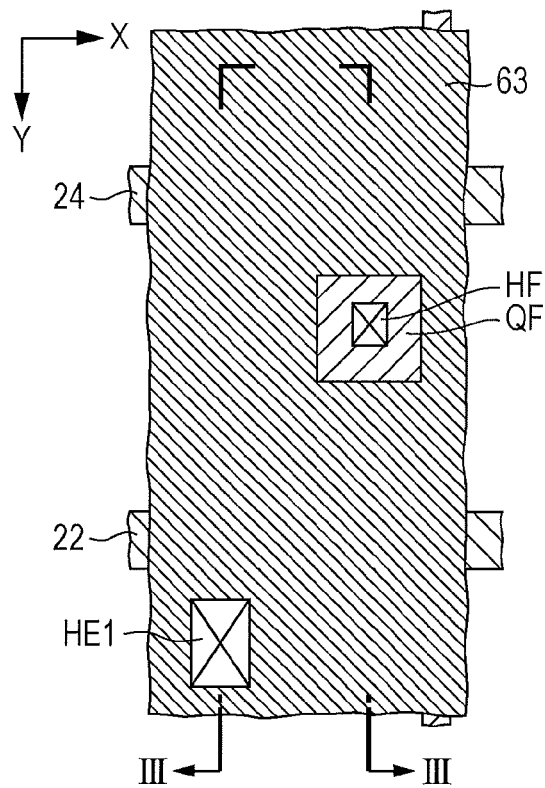
FIG. 13 is a plan view of a wiring layer WF.

An insulation layer LF in FIG. 3 is formed on the surface of the insulation layer LE on which the wiring layer WE is formed. As illustrated in FIG. 3 and FIG. 13, on the surface of the insulation layer LF, a semiconductor pattern that includes a relaying electrode QF for each pixel P is formed from the same layer (a wiring layer WF). The wiring layer WF is formed of a light-shielding conductive material (for example, titanium nitride). As understood from FIG. 13, the relaying electrode QF is conductively connected to the relaying electrode QE of the wiring layer WE via a through hole HF penetrating the insulation layer LF. The relaying electrode QF is formed so as to overlap the opening portion 73 of the second conduction layer 63 in a plan view. That is, the outer peripheral edge of the relaying electrode QF is positioned at the outside of the inner peripheral edge of the opening portion 73 in a plan view. Since the relaying electrode QF is formed of the light-shielding conductive material, the relaying electrode QF prevents the external light from the opening portion 73 from entering the multilayer wiring layer. Therefore, it is advantageous in the point that the current leakage of each transistor T caused by the light irradiation can be prevented.

As illustrated in FIG. 3, on the surface of the insulation layer LF on which the wiring layer WF is formed, a light path adjustment layer 66 is formed. The light path adjustment layer 66 is an optically transparent film body that defines a resonance wavelength in the resonance structure of each pixel P, and is formed of an optically transparent material such as a silicon compound (typically, silicon nitride or silicon oxide). On the surface of the light path adjustment layer 66, the first electrode 451 is individually formed for each pixel P. The first electrode 451 is formed of an optically transparent and conductive material such as, for example, indium tin oxide (ITO). As understood from FIG. 14, the first electrode 451 is a substantially rectangular shaped electrode (a pixel electrode) that functions as an anode of the light emitting element 45, and is conductively connected to the relaying electrode QF of the wiring layer WF via a through hole H penetrating the light path adjustment layer 66. That is, the first electrode 451, as understood from FIG. 3, is conductively connected to the diffusion layer AD of the light emission control transistor T2 via each relaying electrode (QF, QE, QD1, QC1, QB2, and QA3) of the multilayer wiring layer.

Figure 14:
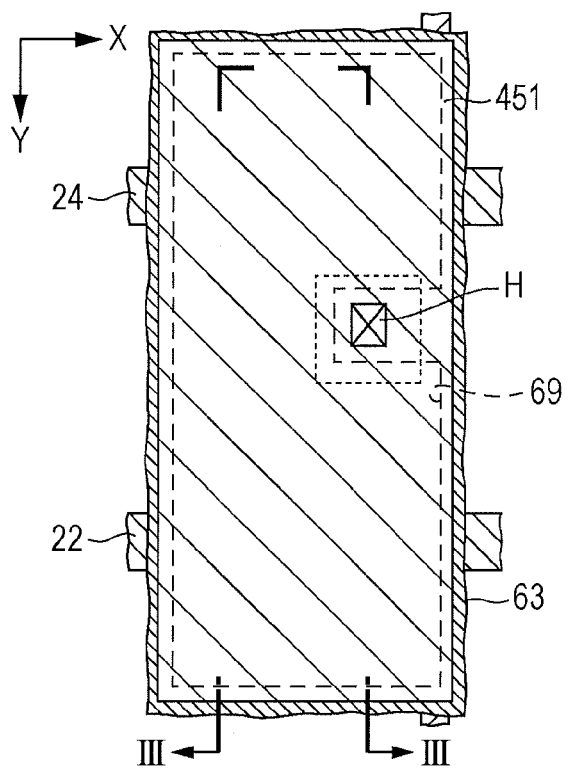
FIG. 14 is a plan view of a first electrode.

On the surface of the light path adjustment layer 66 on which the first electrode 451 is formed, as illustrated in FIG. 3, a pixel definition layer 68 is formed over the entire region of the semiconductor substrate 10. The pixel definition layer 68 is formed of an inorganic insulation material such as a silicon compound (typically, silicon nitride or silicon oxide). An opening portion 69 corresponding to the first electrode 451 is formed on the pixel definition layer 68. In FIG. 14, the inner peripheral edge of the opening portion 69 of the pixel definition layer 68 is illustrated by dashed lines.

As illustrated in FIG. 3, on the surface of the light path adjustment layer 66 on which the first electrode 451 and the pixel definition layer 68 are formed, the light emitting function layer 450 is formed. The light emitting function layer 450 is formed on the entire region of the display region 11 and continues over a plurality of pixels P. The light emitting function layer 450 in the first embodiment is configured to include a light emission layer formed of an organic EL material and emits a white light by the supply of electric current. The white light is a light having a spectrum over the wavelength range of blue, the wavelength range of green, and the wavelength range of red, and at least two peaks are observed in the range of wavelengths of visible light. A transportation layer or an implantation layer for the electrons or holes supplied to the light emission layer can be included in the light emitting function layer 450.

As illustrated in FIG. 3, on the surface of the light emitting function layer 450, the second electrode 452 that functions as a cathod of the light emitting element 45 is formed. The second electrode 452 is formed on the entire region of the semiconductor substrate 10 so as to continue over a plurality of pixels P, and is electrically connected to the mounting terminal 38 to which the power source potential VCT is supplied. Actually, an optical transparent sealing layer that prevents the penetration of external air or water is formed on the entire region of the semiconductor substrate 10 so as to cover the second electrode 452. However, the illustration thereof is omitted in FIG. 3 for the sake of convenience.

As illustrated in FIG. 3, a region (light emission region) which is interposed between the first electrode 451 and the second electrode 452 at the inside of the opening portion 69 of the pixel definition layer 68 in the light emitting function layer 450 emits a light. That is, at the inside of the opening portion 69 of the pixel definition layer 68, a portion where the first electrode 451, the light emitting function layer 450, and the second electrode 452 are deposited functions as the light emitting element 45. As understood from the above description, the pixel definition layer 68 defines the planar shape or size of the light emitting element 45 of each pixel P. The light emitting device 100 in the first embodiment is a micro-display in which the light emitting elements 45 are arrayed in an extremely high definition. For example, an area of one light emitting element 45 (an area of one opening portion 69 of the pixel definition layer 68) is set to be equal to less than 40 µm$^2$ and the gap between each of light emitting elements 45 adjacent to each other in the X direction is set to be equal to or less than 1.5 µm.

The second electrode 452 functions as a semi-transparent reflective layer having a property (semi-transparent reflective) of transmitting a part of light arriving at the surface and reflecting a remaining part. For example, a semi-transparent reflective second electrode 452 is formed by forming a light reflective and conductive material such as an alloy containing silver or magnesium to have a sufficiently thin film thickness. The white light emitted from the light emitting function layer 450 travels back and forth between the second conduction layer 63 (first power conductor 41) and the second electrode 452, and a component of a specific resonance wavelength is selectively amplified, and then, emitted to an observer side (an opposite side to the semiconductor substrate 10) through the second electrode 452. That is, a resonance structure that causes the light emitted from the light emitting function layer 450 to resonate is formed between the second conduction layer 63 which functions as a reflection layer and the second electrode 452 which functions as a semi-transparent reflective layer. The light path adjustment layer 66 described above is an element for individually setting the resonance wavelength (display color) of the resonance structure for each display color of each pixel P. Specifically, the resonance wavelength of the emitted light of each pixel P is set for each display color by appropriately adjusting a light path length (optical distance) between the second conduction layer 63 which configures the resonance structure and the second electrode 452, according to the film thickness of the light path adjustment layer 66. The specific structure of the light emitting device 100 in the first embodiment is as described above.

As described above, in the first embodiment, since the element isolation portion 54 with an STI structure in which the oxide film 84 fills the groove portion 10A formed on the semiconductor substrate 10 is formed between each of the transistors T, compared to the technology disclosed in JP-A-2012-083765 in which an oxide film formed by the LOCOS method is used for isolating the element of each transistor, it is possible to reduce the gap between each of the transistors T. Therefore, it is advantageous in the point that the high density (high definition of a display image) of the light emitting element 45 can be realized. As described above, the configuration in which the high density of the light emitting elements 45 can be realized is particularly preferable for the micro-display on which each light emitting element 45 is arrayed in an extremely high density.

Second Embodiment

Figure 15:
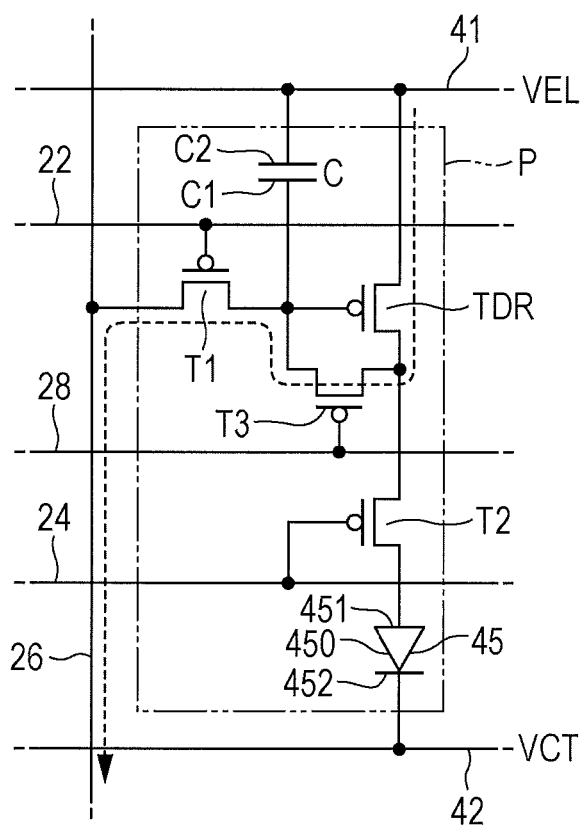
FIG. 15 is a circuit diagram of a pixel in a second embodiment.

FIG. 15 is a circuit diagram of each pixel P in a second embodiment. As illustrated in FIG. 15, the pixel P in the second embodiment has a configuration in which a writing control transistor (a third transistor) T3 is added to the pixel P in the first embodiment. The writing control transistor T3 is interposed between the gate and drain of the drive transistor TDR and controls the electrical connection (conduction and non-conduction) between the gate and drain. That is, when the writing control transistor T3 shifts to an ON state, the drive transistor TDR is connected as a diode connection. The gate of the writing control transistor T3 is connected to the scanning line 22, the control line 24, and the control line 28 extending in the X direction.

During a writing period in which the scanning line drive circuit 32 sequentially selects each scanning line 22, the writing control transistor T3 of each pixel P in the selected row is maintained in the ON state. Therefore, as illustrated as an arrow by a dashed line in FIG. 15, during the writing period, a current (hereafter, referred to as "writing current") that flows from the first power conductor 41 to reach the signal line 26 via the drive transistor TDR, the writing control transistor T3, and the selection transistor T1, is generated. The signal line drive circuit 34 controls the amount of the writing current according to the gradation designated by the image signal for each pixel P. Therefore, when the writing period ends, the gate potential of the drive transistor TDR is set according to the gradation designated by the image signal. During a light emitting period after the writing period, the selection transistor T1 and the writing control transistor T3 shift to the OFF state and the light emission control transistor T2 shifts to the ON state as is similar to that in the first embodiment.

As understood from the above description, the pixel P in the second embodiment is a current writing type pixel circuit in which the gate potential of the drive transistor TDR is controlled according to the amount of the current signal (writing current) supplied to the signal line 26 while the pixel P in the first embodiment is a voltage writing type pixel circuit in which the gate potential of the drive transistor TDR is controlled according to the voltage of the voltage signal (gradation potential) supplied to the signal line 26.

Figure 16:
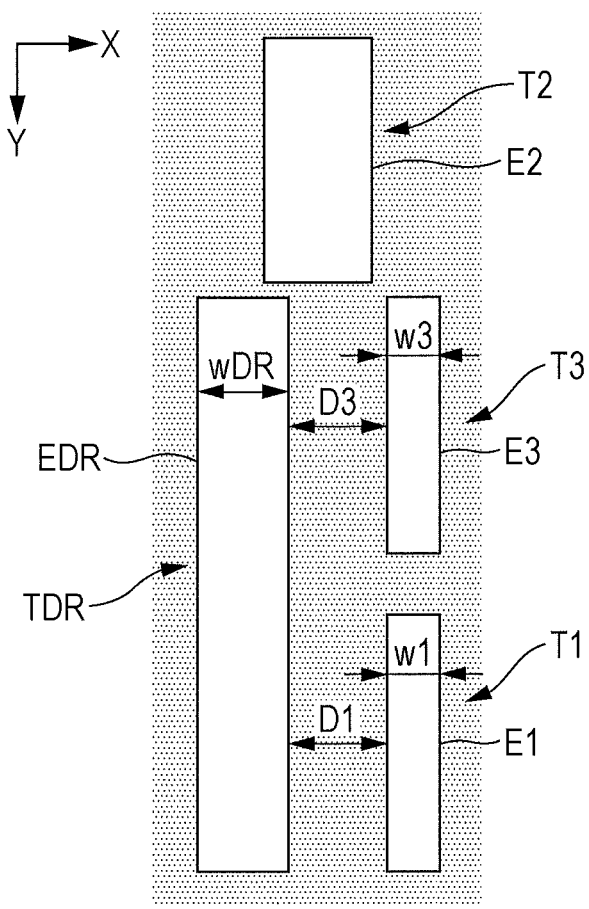
FIG. 16 is a plan view of each element portion and an element isolation portion.

FIG. 16 to FIG. 23 are plan views illustrating the appearances of the surface of the semiconductor substrate 10 in each stage of forming each element of the light emitting device 100 in the second embodiment focusing on one pixel. As illustrated in FIG. 16, a plurality of element portions E (EDR, E1, E2, and E3) corresponding to each transistor T (TDR, T1, T2, and T3) of each pixel P is formed on the well 17 of the semiconductor substrate 10. Each element portion E is demarcated in the island shapes isolated from each other by a groove portion 10A formed on the N-type well 17. As is similar to the first embodiment, the insulation layer 50 that includes the insulation film 52 and the element isolation portion 54 is formed on the surface of the semiconductor substrate 10. In the second embodiment as well as in the first embodiment, the element isolation portion 54 having the STI structure is formed by the method described above referring to FIG. 4.

The element isolation portion 54 in the second embodiment isolates each of the drive transistor TDR, selection transistor T1, and light emission control transistor T2 from each other as is similar to that in the first embodiment, and as understood from FIG. 16, isolates the writing control transistor T3 from the drive transistor TDR, selection transistor T1, and light emission control transistor T2. A width D3 of the element isolation portion 54 positioned between the element portion EDR of the drive transistor TDR and the element portion E3 of the writing control transistor T3 is greater than a channel width w3 of the writing control transistor T3 (or the channel width w1 of the selection transistor T1 or the channel width w2 of the light emission control transistor T2) (D3>w1, w2, and w3), or further preferably, is greater than the channel width wDR of the drive transistor TDR (D3>wDR).

Figure 17:
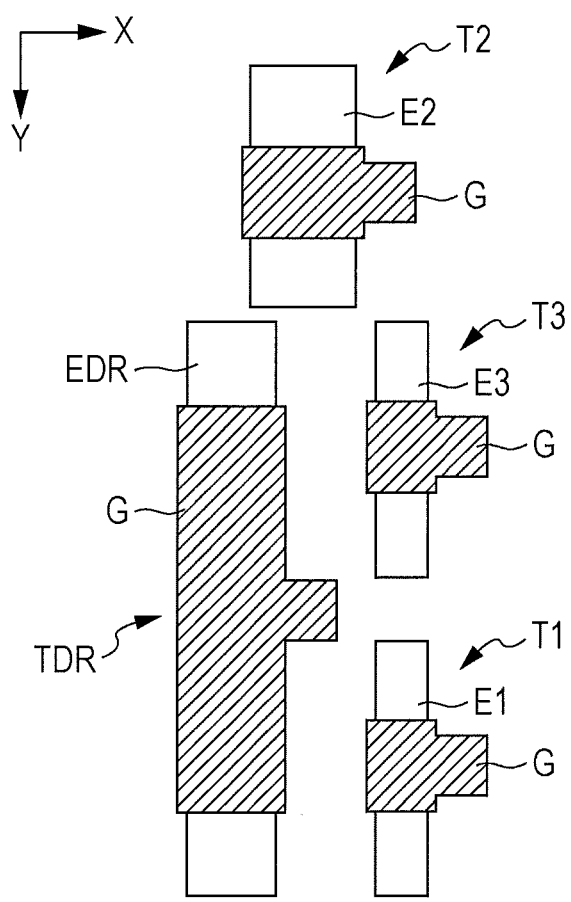
FIG. 17 is a plan view of a gate of each transistor.

On the surface of the insulation layer 50, as illustrated in FIG. 17, the gate G of each transistor T (TDR, T1, T2, and T3) is formed. As is similar to the first embodiment, on the surface of the insulation layer 50 on which the gate G of each transistor T is formed, the multilayer wiring layer is formed, on which a plurality of insulation layers L (LA to LF) and a plurality of wiring layers W (WA to WF) are alternatively deposited.

Figure 18:
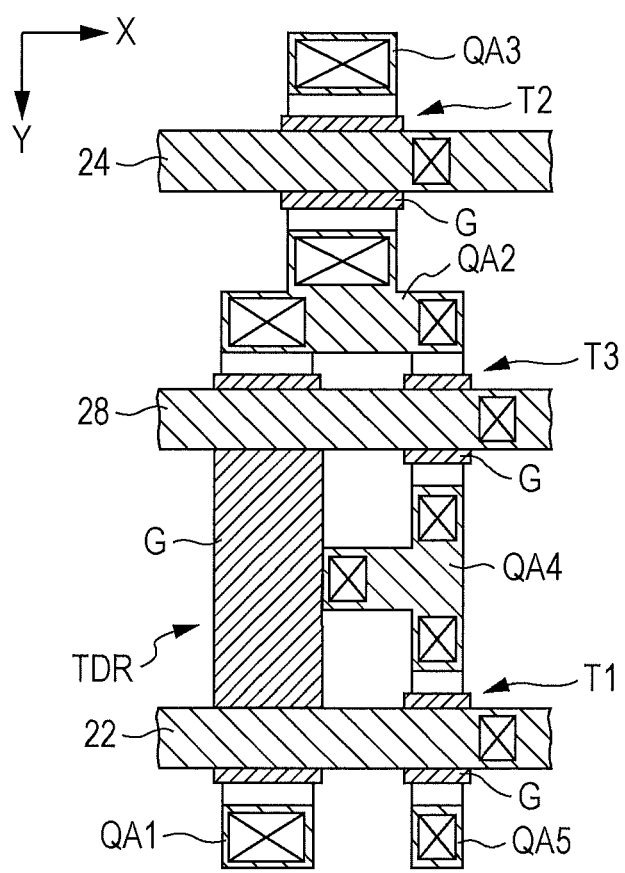
FIG. 18 is a plan view of a wiring layer WA.

As illustrated in FIG. 18, the wiring layer WA formed on the surface of the insulation layer LA includes the scanning line 22, the control line 24, the control line 28, and a plurality of relaying electrodes QA (QA1 to QA5). As is similar to the first embodiment, the scanning line 22 is conductively connected to the gate G of the selection transistor T1 and the control line 24 is conductively connected to the gate G of the light emission control transistor T2. The control line 28 is conductively connected to the gate G of the writing control transistor T3. In addition, as is similar to the first embodiment, the relaying electrode QA1 is conductively connected to the diffusion layer AS of the drive transistor TDR, the relaying electrode QA3 is conductively connected to the diffusion layer AD of the light emission control transistor T2, and the relaying electrode QA5 is conductively connected to the diffusion layer AS of the selection transistor T1. The relaying electrode QA2 is conductively connected to the diffusion layer AD of the drive transistor TDR, the diffusion layer AS of the light emission control transistor T2, and the diffusion layer AS of the writing control transistor T3. The relaying electrode QA4 is conductively connected to the gate of the drive transistor TDR, the diffusion layer AD of the selection transistor T1, and the diffusion layer AS of the writing control transistor T3. That is, as described above referring to FIG. 15, the writing control transistor T3 is interposed between the gate G and the diffusion layer AD (drain) of the drive transistor TDR.

Figure 19:
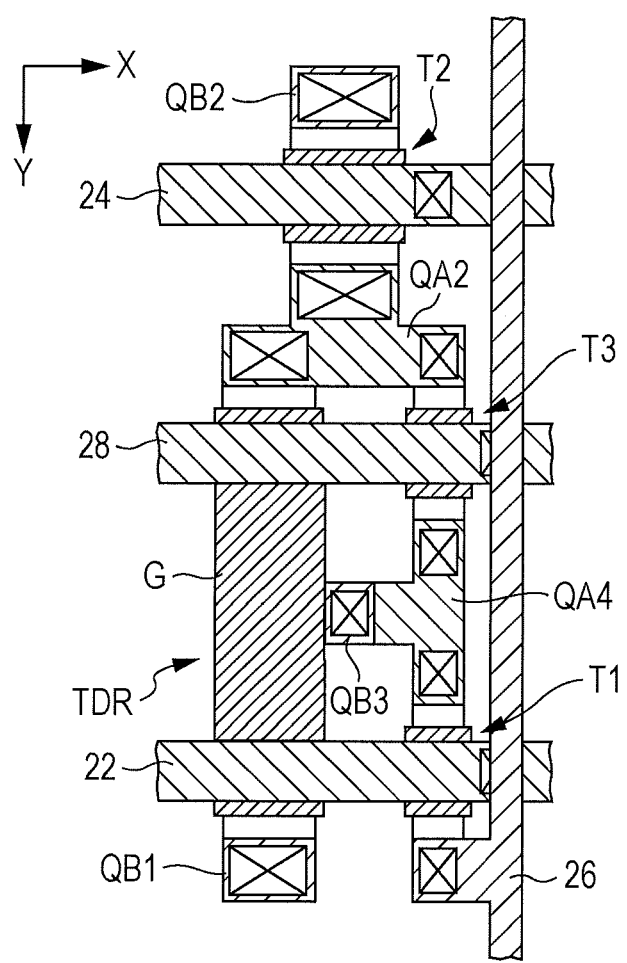
FIG. 19 is a plan view of a wiring layer WB.

As illustrated in FIG. 19, the wiring layer WB formed on the surface of the insulation layer LB includes the signal line 26 and a plurality of relaying electrode QB (QB1 to QB3). The signal line 26, as is similar to the first embodiment, is conductively connected to the diffusion layer AS of the selection transistor T1 via the relaying electrode QA5 of the wiring layer WA. The relaying electrode QB1 is conductively connected to the relaying electrode QA1 of the wiring layer WA, the relaying electrode QB2 is conductively connected to the relaying electrode QA3 of the wiring layer WA, and the relaying electrode QB3 is conductively connected to the relaying electrode QA4 of the wiring layer WA.

Figure 20:
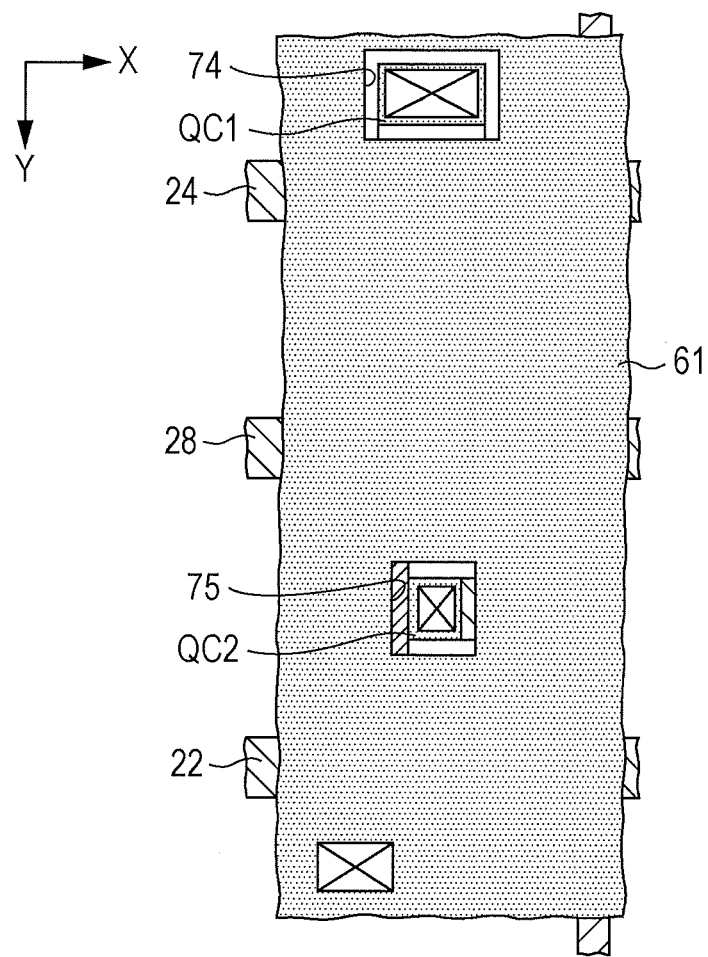
FIG. 20 is a plan view of a wiring layer WC.

As illustrated in FIG. 20, the wiring layer WC formed on the surface of the insulation layer LC includes the first conduction layer 61 and a plurality of relaying electrodes QC (QC1 and QC2). The first conduction layer 61 to which the power source potential VEL is supplied is conductively connected to the relaying electrode QB1 of the wiring layer WB. That is, as is similar to the first embodiment, the first conduction layer 61 functions as the first power conductor 41 that supplies the power source potential VEL to the diffusion layer AS of the drive transistor TDR. On the first conduction layer 61, an opening portion 74 and an opening portion 75 are formed for each pixel P. The relaying electrode QC1 is formed inside of the opening portion 74 and is conductively connected to the relaying electrode QB2 of the wiring layer WB, and the relaying electrode QC2 is formed inside of the opening portion 75 and is conductively connected to the relaying electrode QB3 of the wiring layer WB.

Figure 21:
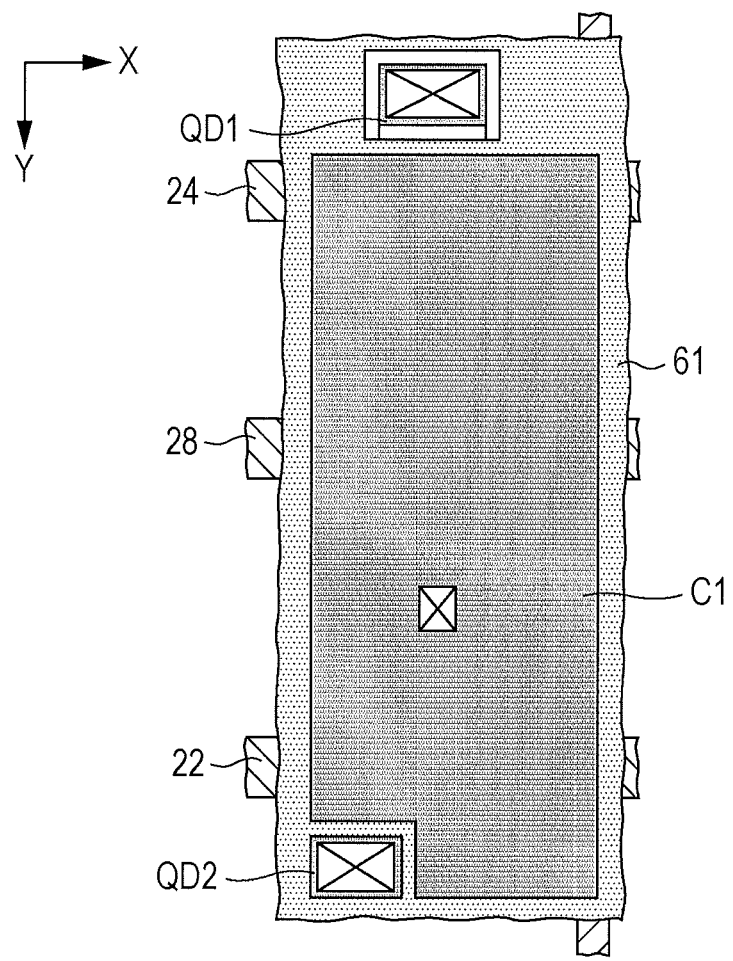
FIG. 21 is a plan view of a wiring layer WD.

As illustrated in FIG. 21, the wiring layer WD formed on the surface of the insulation layer LD includes the first electrode C1 of the capacitance element C and a plurality of relaying electrodes QD (QD1 and QD2). The first electrode C1 is conductively connected to the relaying electrode QC2 of the wiring layer WC. In addition, the relaying electrode QD1 is conductively connected to the relaying electrode QC1 of the wiring layer WC and the relaying electrode QD2 is conductively connected to the first conduction layer 61.

Figure 22:
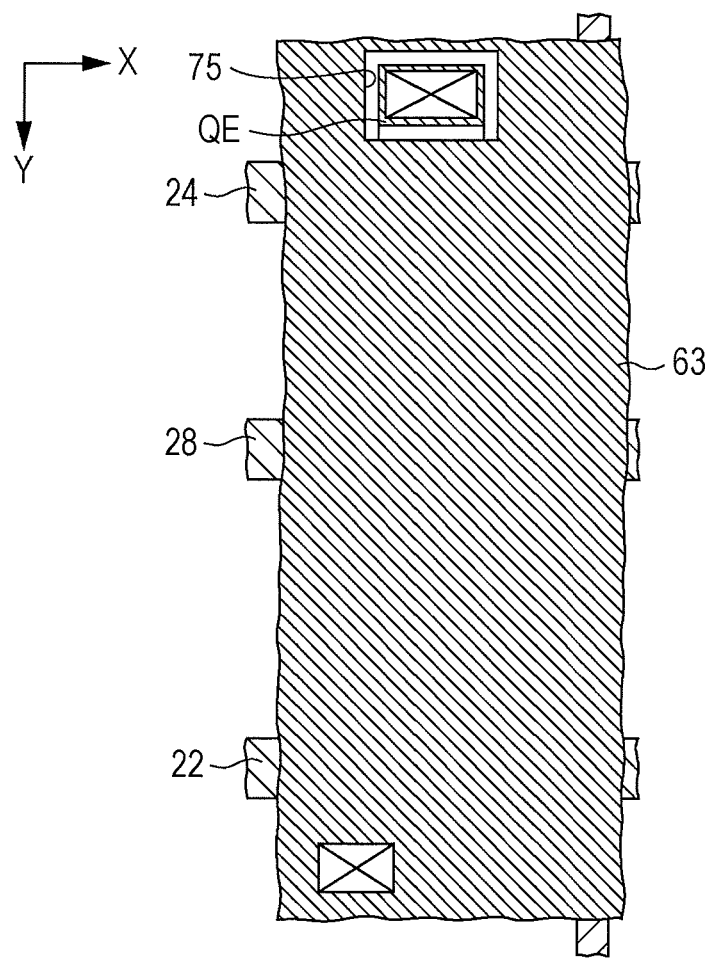
FIG. 22 is a plan view of a wiring layer WE.

As illustrated in FIG. 22, the wiring layer WE formed on the surface of the insulation layer LE, as is similar to the first embodiment, is formed of the light-reflective and conductive material, and includes the second conduction layer 63 and the relaying electrode QE. The second conduction layer 63 is conductively connected to the relaying electrode QD2 of the wiring layer WE. That is, the first conduction layer 61 of the wiring layer WC and the second conduction layer 63 of the wiring layer WE are conductively connected via the relaying electrode QD2 of the wiring layer WD. Therefore, as is similar to the first embodiment, the first conduction layer 61 and the second conduction layer 63 function as the first power conductor 41 that supplies the power source potential VEL and the second electrode C2 that forms the capacitance element C between itself and the first electrode C1. On the other hand, the relaying electrode QE is formed inside of the opening portion 75 of the second conduction layer 63 and is conductively connected to the relaying electrode QD1 of the wiring layer WD.

Figure 23:
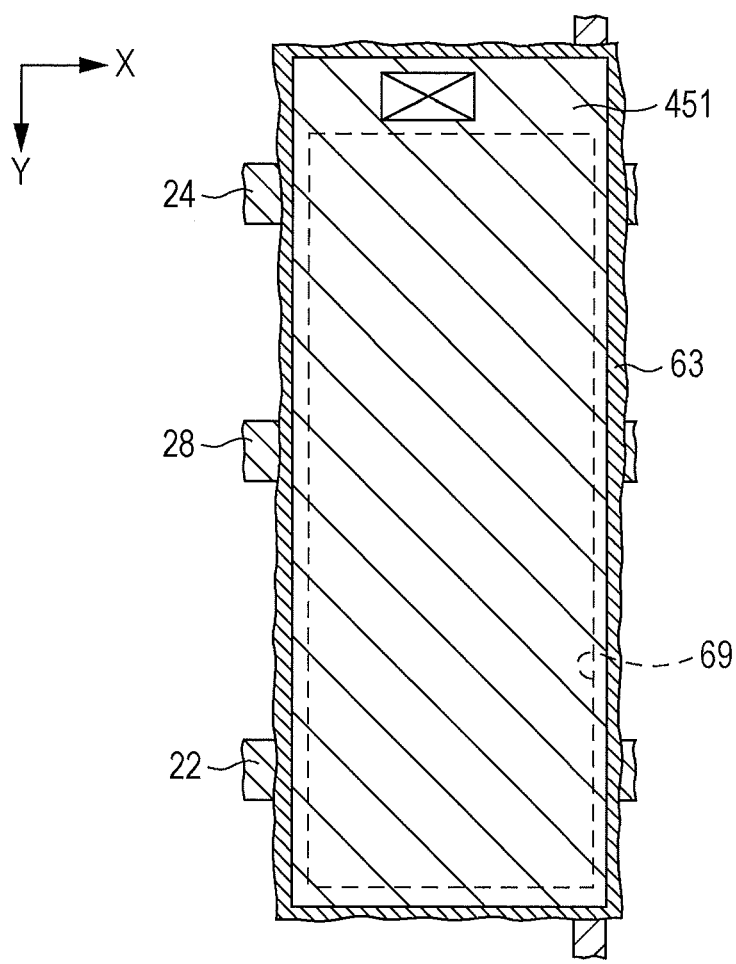
FIG. 23 is a plan view of a first electrode.

As is similar to the first embodiment, the wiring layer WF formed on the surface of the insulation layer LF includes the light-shielding relaying electrode QF (not illustrated) that overlaps the opening portion 75 in a plan view for each pixel P. On the surface of the insulation layer LF, the light path adjustment layer 66 is formed, and on the surface of the light path adjustment layer 66, as illustrated in FIG. 23, the first electrode 451 is formed for each pixel P and is conductively connected to the relaying electrode QF of the wiring layer WF. As understood from the above description, the first electrode 451 in the second embodiment, as is similar to the first embodiment, is conductively connected to the diffusion layer AD of the light emission control transistor T2 via each relaying electrode (QF, QE, QD1, QC1, QB2, and QA3) of the multilayer wiring layer. The configuration of the light emitting function layer 450 and the second electrode 452 is similar to that in the first embodiment. In the second embodiment described above, advantages similar to those in the first embodiment are realized as well.

Modification Example

Each embodiment described above can be variously modified. Specific modification aspects will be exemplified below. Two or more arbitrarily selected aspects can be appropriately combined to the extent of being not inconsistent with each other.

1. The configuration of the pixel P is not limited to the illustration in FIG. 2 or FIG. 15. For example, a configuration in which the light emission control transistor T2 in each embodiment described above is omitted (a configuration in which the first electrode 451 of the light emitting element 45 is directly connected to the drain of the drive transistor TDR) may be adopted. In addition, a configuration can be adopted, in which an error of a threshold voltage can be compensated for by setting the voltage between the gate and source of the drive transistor TDR in the diode connection as the threshold voltage of the drive transistor TDR and causing the potential of the gate of the drive transistor TDR to change according to the gradation potential of the signal line 26 via the capacitance element interposed between the drive transistor TDR and the selection transistor T1. As the technology disclosed in JP-A-2013-088611, a capacitance element for setting the gate potential of the drive transistor TDR can also be disposed outside of the pixel P.

2. The configuration of the light emitting element 45 is not limited to the illustration in each embodiment. For example, in each embodiment described above, the light emitting function layer 450 that generates the white light is continuously formed over a plurality of pixels P. However, the light emitting function layer 450 that emits single color light having a wavelength corresponding to the display color of each pixel P also can be individually formed for each pixel P. In addition, in each embodiment described above, the resonance structure is formed between the first power conductor 41 (reflection layer) and the second electrode 452 (semi-transparent reflective layer). However, for example, the first electrode 451 may be formed of a reflective and conductive material and then, the resonance structure can be formed between the first electrode 451 (reflection layer) and the second electrode 452 (semi-transparent reflective layer).

3. In each embodiment described above, the light emitting element 45 using the organic EL material is illustrated. However, the invention is similarly applied to a configuration using the light emitting element 45 in which the light emission layer is formed of an inorganic EL material, or a light emitting element 45 such as an LED.

Electronic Apparatus

Figure 24:
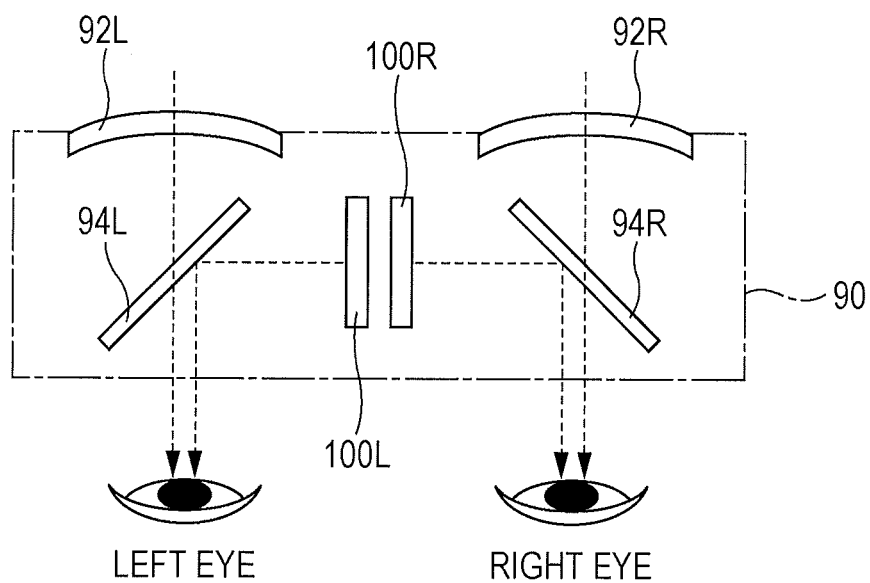
FIG. 24 is a schematic diagram of a head mounted type display device which is an example of an electronic apparatus.

The light emitting device 100 in each embodiment described above is preferably used as a display device of various electronic apparatuses. In FIG. 24, a head mounted type display device 90 (HMD: Head Mounted Display) using the light emitting device 100 illustrated in each embodiment described above is illustrated as an electronic apparatus.

The display device 90 is an electronic apparatus which can be mounted on the head of a user, and includes a transmission portion (lens) 92L that overlaps the left eye of the user, a transmission portion 92R that overlaps the right eye of the user, a light emitting device 100L for the left eye and a half mirror 94L, and a light emitting device 100R for the right eye and a half mirror 94R. The light emitting device 100L and the light emitting device 100R are disposed such that the emitted light travels in the opposite direction to each other. The half mirror 94L for the left eye causes the transmitted light of the transmission portion 92L to be transmitted to the left eye side of the user and causes the light emitted from the light emitting device 100L to be reflected to the left eye side of the user. Similarly, the half mirror 94R for the right eye causes the transmitted light of the transmission portion 92R to be transmitted to the right eye side of the user and causes the light emitted from the light emitting device 100R to be reflected to the right eye side of the user. Therefore, the user perceives an image obtained by superimposing an image observed via the transmission portion 92L and the transmission portion 92R and the image displayed by each light emitting device 100. In addition, it is possible to cause the user to perceive a stereoscopic effect of the displayed image by causing the stereoscopic images to which a mutual disparity is given (the image for the left eye and the image for the right eye) to be displayed on the light emitting device 100L and the light emitting device 100R.

An electronic apparatus to which the light emitting device 100 in each embodiment described above is applied is not limited to the display device 90 in FIG. 24. For example, the light emitting device 100 in the invention is preferably used in an electronic viewfinder (EVF) as well that is used in an imaging apparatus such as a video camera or a still camera. In addition, the light emitting device 100 in the invention can be adopted in various electronic apparatuses such as a mobile phone, a mobile information terminal (a smart phone), a monitor for a television set or a personal computer, and a car navigation apparatus.

What is claimed is:

1. A light emitting device comprising:
   a semiconductor substrate including an n-type well that is disposed on the surface of a p-type substrate;
   a plurality of transistors including a drive transistor which controls a drive current according to a potential of a gate, the plurality of transistors being formed on the semiconductor substrate;
   a light emitting element that emits a light having a brightness corresponding to the drive current; and
   an element isolation portion that isolates one transistor from another transistor among the plurality of transistors, the element isolation portion having a Shallow Trench Isolation structure formed in a partially removed region of the n-type well on the semiconductor substrate.

2. The light emitting device according to claim 1,
   wherein the plurality of transistors includes a first transistor that sets the potential of the gate of the drive transistor according to a gradation potential, and
   wherein the element isolation portion isolates the drive transistor from the first transistor.

3. The light emitting device according to claim 1,
   wherein the plurality of transistors includes a second transistor that is disposed on a path of the drive current and controls a supply and cut-off of the drive current to the light emitting element, and
   wherein the element isolation portion isolates the drive transistor from the second transistor.

4. The light emitting device according to claim 3,
   wherein the plurality of transistors includes a third transistor that controls conduction between the gate and a drain of the drive transistor, and
   wherein the element isolation portion isolates the drive transistor from the third transistor.

5. The light emitting device according to claim 1,
   wherein each of the plurality of transistors includes a diffusion layer that functions as one of a source or the drain, and
   wherein a thickness of the element isolation portion is greater than a thickness of the diffusion layer.

6. The light emitting device according claim 1,
   wherein a width of the element isolation portion is greater than a channel width of one transistor among the plurality of transistors.

7. The light emitting device according to claim 1, the light emitting device further comprising:
   a plurality of pixels, each of the plurality of pixels including at least two transistors, the at least two transistors including the drive transistor, and
   wherein the element isolation portion isolates one of the at least two transistors of a first pixel among the plurality of pixels from one of the at least two transistors of a second pixel adjacent to the first pixel.

8. The light emitting device according to claim 7,
   wherein, in the element isolation portion, a width of a portion that isolates the one of the at least two transistors of the first pixel from the one of the at least two transistors of the second pixel is greater than the channel width of one transistor among the plurality of transistors.

9. The light emitting device according to claim 1,
wherein the element isolation portion has a structure in which an insulator fills a groove portion formed on the semiconductor substrate.

10. A light emitting device comprising:
a semiconductor substrate including an n-type well that is disposed on the surface of a p-type substrate;
a plurality of transistors formed on the semiconductor substrate;
a light emitting element;
a groove portion formed in a partially removed region of the n-type well on the semiconductor substrate; and
an insulator that fills inside of the groove portion,
the plurality of transistors including a drive transistor that controls a drive current flowing in the light emitting element according to a potential of a gate, and
the insulator being disposed between one transistor and another transistor among the plurality of transistors.

11. An electronic apparatus comprising;
the light emitting device according to claim 1.

12. An electronic apparatus comprising;
the light emitting device according to claim 2.

13. An electronic apparatus comprising;
the light emitting device according to claim 3.

14. An electronic apparatus comprising;
the light emitting device according to claim 4.

15. An electronic apparatus comprising;
the light emitting device according to claim 5.

16. An electronic apparatus comprising;
the light emitting device according to claim 6.

17. An electronic apparatus comprising;
the light emitting device according to claim 7.

18. An electronic apparatus comprising;
the light emitting device according to claim 8.

19. An electronic apparatus comprising;
the light emitting device according to claim 9.

20. An electronic apparatus comprising;
the light emitting device according to claim 10.

21. A light emitting device comprising:
a semiconductor substrate including an n-type well that is disposed on the surface of a p-type substrate;
a plurality of transistors including a drive transistor which controls a drive current according to a potential of a gate, the plurality of transistors being formed on the semiconductor substrate;
a light emitting element that emits a light having a brightness corresponding to the drive current; and
an element isolation portion that isolates one transistor from another transistor among the plurality of transistors, the element isolation portion having a groove portion formed in a partially remove region of the n-type well on the semiconductor substrate that is deeper in a thickness direction of the semiconductor substrate than a thickness of (i) a diffusion layer of the one transistor or (ii) a diffusion layer of the another transistor.

\* \* \* \* \*